US009473244B2

(12) United States Patent
Zhang et al.

(10) Patent No.: US 9,473,244 B2
(45) Date of Patent: Oct. 18, 2016

(54) FLEXIBLE 400G AND 1 TB/S TRANSMISSION OVER TRANSOCEANIC DISTANCE

(71) Applicant: NEC Laboratories America, Inc., Princeton, NJ (US)

(72) Inventors: Shaoliang Zhang, Princeton, NJ (US); Fatih Yaman, Monmouth Junction, NJ (US)

(73) Assignee: NEC Corporation (JP)

( * ) Notice: Subject to any disclaimer, the term of this patent is extended or adjusted under 35 U.S.C. 154(b) by 48 days.

(21) Appl. No.: 14/514,952

(22) Filed: Oct. 15, 2014

(65) Prior Publication Data

US 2015/0104186 A1 Apr. 16, 2015

Related U.S. Application Data

(60) Provisional application No. 61/890,903, filed on Oct. 15, 2013.

(51) Int. Cl.

*H04L 27/34* (2006.01)
*H04B 10/40* (2013.01)
*H04L 27/36* (2006.01)
*H04L 1/00* (2006.01)
*H04L 27/00* (2006.01)
*H04L 27/26* (2006.01)
*H03M 13/25* (2006.01)
*H04L 25/03* (2006.01)

(52) U.S. Cl.

CPC ........... *H04B 10/40* (2013.01); *H03M 13/256* (2013.01); *H04L 1/006* (2013.01); *H04L 1/0041* (2013.01); *H04L 27/0008* (2013.01); *H04L 27/2628* (2013.01); *H04L 27/362* (2013.01); *H04L 25/03834* (2013.01); *H04L 27/34* (2013.01)

(58) Field of Classification Search

CPC .............. H04B 10/40; H04L 27/0008; H04L 27/2628; H04L 27/362
USPC .......................................................... 398/185
See application file for complete search history.

(56) References Cited

U.S. PATENT DOCUMENTS

| | | | | |
|---|---|---|---|---|
| 8,831,439 B2 * | 9/2014 | Wu | .................... | H04B 10/2575 398/183 |
| 2003/0223504 A1 * | 12/2003 | Chen | .................. | H03H 17/0294 375/260 |

(Continued)

OTHER PUBLICATIONS

J. Renaudier [Long-haul WDM transmission of 448 Gbit/s polarisation-division multiplexed 16-ary quadrature amplitude modulation using coherent detection Electronics Letters Aug. 2011].*

(Continued)

*Primary Examiner* — OOmmen Jacob
(74) *Attorney, Agent, or Firm* — Joseph Kolodka

(57) ABSTRACT

A method of transmitting a data signal is provided that includes integrating a trellis encoder/decoder into a transmitter for 16 quadrative amplitude modulation (QAM) to provide a first and second mode of modulation, wherein each mode has a same baud rate. Data is transmitted from the transmitter at the first mode of modulation with a plurality of first subcarriers with DP16QAM modulation to provide a substantially 400G data transmission rate, or data is transmitted from the transmitter at the second mode of modulation with a plurality of second subcarriers with trellis coded modulation to provide a substantially 1T data transmission rate.

9 Claims, 7 Drawing Sheets

(56) References Cited

U.S. PATENT DOCUMENTS

2004/0141569 A1* 7/2004 Agazzi ............... H04B 10/2575 375/302
2006/0269294 A1* 11/2006 Kikuchi ............. H04B 10/5051 398/161
2009/0196602 A1* 8/2009 Saunders ........... H04B 10/5053 398/26
2011/0255875 A1* 10/2011 Mertz ................ H04B 10/5561 398/183
2012/0141135 A1* 6/2012 Yang .................... H04B 10/516 398/140
2012/0321323 A1* 12/2012 Huang ............... H04B 10/5053 398/185
2015/0104186 A1* 4/2015 Zhang ..................... H04L 1/006 398/135

OTHER PUBLICATIONS

Lu ["40-Gbaud 16-QAM transmitter using tandem IQ modulators with binary driving electronic signals" Optics Express Oct. 2010].*
McDermott ["Next Generation Optical Transport Networks—From 100G to 1T Beyond" Fujitsu Apr. 2011].*
Voois ["200G Single-Wavelength Transmission for Metro and Superchannel Applications" Clarify Sep. 2013].*
Rahn, J. et al., "250Gb/s Real-time PIC-based Super-Channel Transmission over a Gridless 6000km Terrestrial Link," OSA/OFC/NFOEC, 2012. (3 Pages).
Renaudier, J. et al., "1-Tb/s Transceiver Spanning Over Just Three 50-GHz Frequency Slots for Long-Haul Systems," Optical Communication (ECOC 2013), Sep. 2013. (3 Pages).
Renaudier, J. et al., "Spectrally Efficient Long-Haul Transmission of 22-Tb/s using 40-Gbaud PDM-16QAM with Coherent Detection," Optical Fiber Communication Conference and Exposition (OFC/NFOEC), Mar. 2012. (3 pages).
Ungerboeck, G., "Trellis-Coded Modulation with Redundant Signal sets Part I/II," Communications Magazine, IEEE. Feb. 1987. vol. 25, No. 2. pp. 5-21.
Zhang, H., "200 Gb/s and Dual Wavelength 400 Gb/s Transmission over Transpacific Distance at 6.0 b/s/Hz Spectral Efficiency," Feb. 15, 2014. Journal of Lightwave Technology. vol. 32, No. 4. (pp. 832-839).

* cited by examiner

FLEXIBLE 400G AND 1 TB/S TRANSMISSION OVER TRANSOCEANIC DISTANCE

RELATED APPLICATION INFORMATION

This application claims priority to provisional application Ser. No. 61/890,903 filed on Oct. 15, 2013, incorporated herein by reference.

BACKGROUND

1. Technical Field

The present invention relates to strategies for data transmission over transoceanic distances, and more particularly to transmission of 400G and 1T data rates over transoceanic distances.

2. Description of the Related Art

For transoceanic distances, current 400G and 1T data transmission solutions are limited to spectral efficiencies below 6.5 b/s/Hz, which require multicarrier implementation due to the bandwidth limitations of components. Minimizing the cost of such multicarrier solutions requires reducing the number of subcarriers by increasing the operating baud-rate as high as possible. At the same time, the transponder design should be able to deliver both 400G and 1T data rates with a simple low-cost design, and preferably without changing the baud-rate.

SUMMARY

These and other drawbacks and disadvantages of the prior art can be addressed by the present principles, which may be applied to the transmission of 400G and 1T data rates over transoceanic distances. In some embodiments, the methods and structures disclosed herein relate to the transmission of a 400G/1T flexible transponder based on two-subcarrier 400G trellis-coded modulation (TCM)-DP16QAM, and four-subcarrier 1T DP16QAM operating at a fixed 40 Gbaud.

In one embodiment, a method of transmitting a data signal is provided that includes integrating a trellis encoder/decoder into a transreceiver for 16 quadrative amplitude modulation (QAM) to provide a first and second mode of modulation. Each of the first and second mode of modulation has a same baud rate. The method further includes transmitting data from the transreceiver via a processor. The data is transmitted at the first mode of modulation with a plurality of first subcarriers with DP16QAM modulation to provide a substantially 1T data transmission rate, or the data is transmitted from the transreceiver at the second mode of modulation with a plurality of second subcarriers with trellis coded modulation to provide a substantially 400G data transmission rate.

In another aspect of the present disclosure, a method of receiving a data signal is provided. The method of receiving the data signal may include integrating a trellis encoder/decoder into a transreceiver for 16 quadrative amplitude modulation (QAM). In some embodiments, the transreceiver is configured for receiving a first data signal that has been transmitted using a first mode of modulation for a 1T data transmission rate, or receiving a second data signal that has been transmitted using a second mode of modulation for a 400G data transmission rate. In some embodiments, the method includes receiving a data signal with the transreceiver, the data being decoded with a processor. The first mode of modulation of the 1T data transmission rate is decoded using a 16QAM slicer, or the second mode of modulation of the 400G data transmission rate is decoded using a trellis code modulation (TCM) decoder followed by the 16QAM slicer.

In yet another aspect of the present disclosure, a system is provided for transmitting a data signal. The system may include an integration module for integrating a trellis encoder/decoder into a transreceiver for 16 quadrative amplitude modulation (QAM) to provide a first and second mode of modulation, wherein each mode has a same baud rate. In some embodiments, the system further includes a data transmission module for transmitting data from the transreceiver with a processor. The data can be transmitted at the first mode of modulation with a plurality of first subcarriers with DP16QAM modulation to provide a substantially 1T data transmission rate, or the data can be transmitted from the transreceiver at the second mode of modulation with a plurality of second subcarriers with trellis coded modulation to provide a substantially 400G data transmission rate.

In an even further aspect of the present disclosure, a system is provided for receiving a data signal. In some embodiments, the system for receiving a data signal may include a trellis coding module for integrating a trellis encoder/decoder into a transreceiver for 16 quadrative amplitude modulation (QAM). The transreceiver may be configured for receiving a first data signal that has been transmitted using a first mode of modulation for a 1T data transmission rate, or for receiving a second data signal that has been transmitted using a second mode of modulation for a 400G data transmission rate. The system further includes a receiving module for receiving a data signal with the transreceiver. The data received in the receiving module being decoded with a processor. The first mode of modulation of the 1T data transmission rate may be decoded using a 16QAM slicer, or the second mode of modulation of the 400G data transmission rate may be decoded using a trellis code modulation (TCM) decoder followed by the 16QAM slicer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The methods, systems and computer products disclosed herein are applicable to the transmission of 400G (400Gbits/sec) and 1T (1Tbits/sec) data rates over great distances, which can be on the order of transoceanic distances. The present principles are directed to incorporating a trellis encoder/decoder into a DP-16QAM transmitter, which can provide two modes at the same 40G baudrate, i.e., a 250G per carrier 16QAM mode and a 250 G per carrier Trellis-coded modulation (TCM) 16QAM mode.

As used herein, the abbreviation "QAM" stands for quadrative amplitude modulation (QAM). Modulation is the process of varying one or more properties of a periodic waveform, called the carrier signal (high frequency signal), with a modulating signal that typically contains information to be transmitted. For digital data transfer, QAM is a modulation scheme that includes two digital bit streams, by changing (modulating) the amplitudes of two carrier waves, e.g., sine wave and cosine wave, using the amplitude-shift keying (ASK) digital modulation scheme. The two carrier waves, usually sinusoids, are out of phase with each other by 90° and are thus called quadrature carriers or quadrature components. The modulated waves are summed, and the final waveform is a combination of both phase-shift keying (PSK) and amplitude-shift keying (ASK). In digital QAM, a finite number of at least two phases and at least two amplitudes are used.

One advantage of using QAM is that it is a higher order form of modulation and as a result it is able to carry more bits of information per symbol. By selecting a higher order format of QAM, the data rate of a link can be increased. As, used herein, "16QAM" refers to QAM modulation scheme that employs 4 bits per symbol, and a 1/4 bit rate. The acronym "DP" stands for dual polarization.

Figure 1:
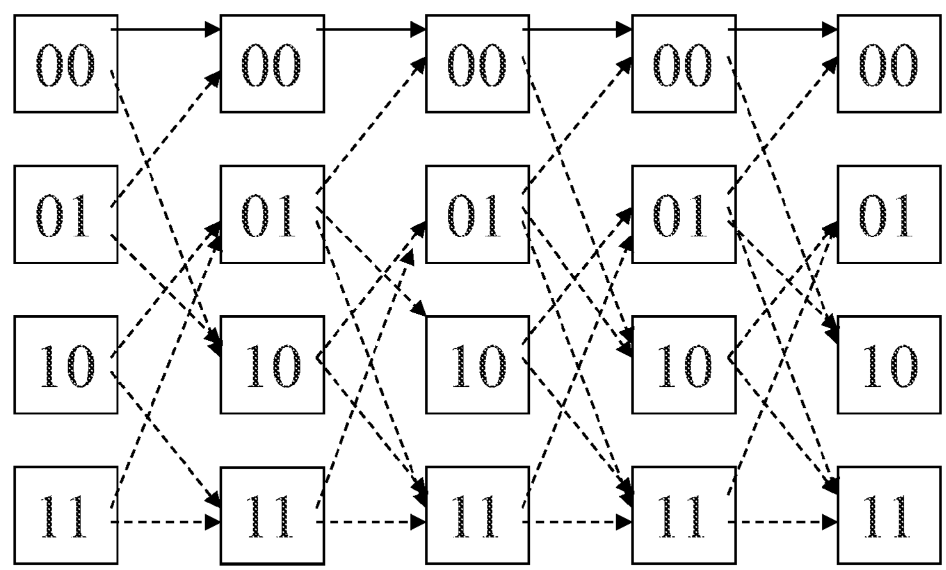
FIG. 1 shows an exemplary state diagram of a trellis modulation technique, in accordance with an embodiment of the present principles.

As indicated above, in some embodiments the methods, systems, and computer program products that are disclosed herein incorporate a trellis encoder/decoder into the DP-16QAM transmitter, which allows for two modes at the same 40G baud rate, i.e., a 250G per carrier 16AQAM and a 250G per carrier Trellis-coded modulation (TCM) 16QAM. As used herein, "trellis modulation" is a modulation scheme for transmission of information in digital communications. In some examples, it combines the choice of a modulation scheme with that of a convolutional code together for the purpose of gaining noise immunity over encoded transmission without expanding the signal bandwidth or increasing the transmitted power. The name trellis was coined, because a state diagram of the technique, when drawn on paper, closely resembles the trellis lattice, as depicted in FIG. 1. The modulation scheme includes a convolutional code of rates (r,r+1). Trellis modulation applies a parity check on a per symbol basis instead of applying the parity check to the bit stream then modulating the bits.

The presence of the of the proposed encoder can provide for more flexibility to the 400G/1T transponder, which could select different modes according to the specific link/performance. Due to the presence of TCM in the system, the signals are more tolerant to the transmission impairments and can provide more system margin compared to DP16QAM signal. As used herein, a transponder is the element that sends and receives the optical signal from a transmission media, such as a fiber, e.g., optical fiber. A transmitter provides the optical signal to the transmission media. A transceiver is a device comprising both a transmitter and a receiver which are combined and share common circuitry or a single housing.

In some embodiments, the proposed transceiver operates in two modes. In the first mode, the transceiver can transmit and receive DP16QAM modulation without modification. With this first mode of modulation, a data rate of 250GB/s may be achieved per subcarrier at 40Gbaud. The first mode of modulation may have a 25% to 30% soft decoding forward error correction (SDFEC) overhead. For example, the SDFEC may be 28%.

In the second mode, trellis code modulation (TCM) is used to reduce the bit rate to 200G per subcarrier, and to increase receiver sensitivity. In some embodiments, trellis code modulation is a way of applying convolution coding based on constellation points rather than on the binary stream. Typically, as a result of the TCM, the number of data bits carried by each symbol per polarization is reduced from 4 bits to 3 bits. As such, each subcarrier is capable of transmitting 200G at 40GBaud with only a 15% to 25% hard decoding forward correct (HDFEC) overhead. For example, the HDFEC may be substantially 20%.

In some embodiments, employing trellis code modulation into the transceiver provides a number of advantages, such as increased flexibility in the transceiver design. For example, a transreceiver employing trellis coded modulation can provide for a large increase in receiver sensitivity in return for the reduced spectral efficiency, when compared to a transreceiver that does not employ trellis coded modulation. Additionally, the core of the transmitter and received digital signal processor (DSP) is not modified by the trellis coded modulation, as the transreceiver is based on a 16QAM constellation. Further, the trellis coded modulation encoder and decoder add relatively low complexity compared to the effective overhead. The details of the methods, systems and computer products that are disclosed herein including the transceiver that employs trellis coded modulation is not described with greater detail with reference to FIGS. 1-8C.

Figure 2:
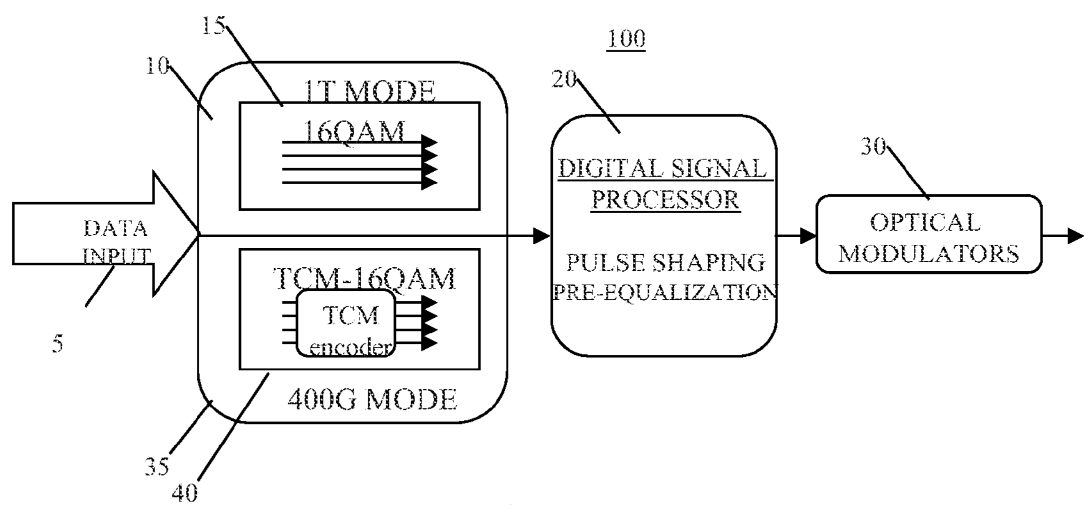
FIG. 2 is a block/flow diagram of a system and method for transmitting a data signal, in accordance with one embodiment of the present disclosure.

FIG. 2 outlines the architecture of the transceiver provided herein, wherein the transceiver can switch from a 1T data rate mode to a 400G data rate mode. The transreceiver depicted in FIG. 2 demonstrates one embodiment of transmission of a 400G/1T flexible transponder based on two-subcarrier 400G trellis-coded modulation (TCM)-DP16QAM, and four subcarrier 1T DP16QAM operating at a fixed baud rate, e.g., operating at a fixed baud rate of substantially 40 Gbaud. In some embodiments, a trellis encode/decoder is incorporated into a DP-16QAM transmitter, which could have two modes at the same 40G baudrate, i.e., a first mode at 250G per carrier 16QAM and a second mode at 250G per carrier Trellis-coded modulation (TCM) 16QAM. Integration of the trellis encoder/decoder into the transreceiver for 16 quadrative amplitude modulation (QAM) may be provided by an integration module, which can include the application of a hardware processor and memory. The presence of the proposed encoder may provide more flexibility to the 400G/1T transponder, so that the 400G/1T transponder could select different modes according to the specific link/performance.

In some embodiments, the 1T mode (also referred to as the first mode) can transmit more data rates, equivalent to higher spectral efficiency, when the link has higher system margin for 16QAM signals. If the link is experiencing interference to have lower/no system margin, the transceiver could automatically switch to TCM mode (also referred to as the second mode) to provide higher receiver sensitivity at the expense of lower spectral efficiency compared to 1T mode. All the modes share the same hardware architecture and even receiver-side digital signal processing (DSP) algorithm, thus making the transponder more flexible than other proposals. Additionally, the transponder uses less power than prior proposals that do not employ trellis code modulation.

FIG. 2 outlines how the architecture of the flexible transceiver can easily switch from the 1T mode to the 400G mode. Bit mapping may begin at the transmitter 100 of the transceiver with bitmapping, in which a data input 5 is provided by an electrical signal. In the first mode, i.e., 1T mode 10, the incoming bits are just mapped into the 16QAM modulation points using a Gray bit mapping rule. The 16QAM encoder 15 takes in 250Gb/s, maps the incoming bits into 16QAM modulation points using a bit mapping rule, and sends the Gray-coded symbols for the subsequent pulse-shaping and pre-equalization at the digital signal processor (DSP) 20. Following pulse-shaping/pre-equalization at the DSP, the digital signal is converted to an optical signal at the optical modulator 30, which may referred to as upconverting to optical carriers.

In the second mode, i.e., 400G mode 35, the incoming bits of the electrical signal are first transmitted through a trellis code modulation (TCM) encoder 40. In some embodiments, the code modulation (TCM) encoder may be provided by integrating a trellis encoder/decoder into a transreceiver for 16 quadrative amplitude modulation (QAM). In some embodiments, transmitting data from the transceiver using one of the first mode, i.e., 1T mode 10, and second mode, i.e., 400G mode 30, of data transmission may include a data transmission module, which can include a hardware processor and memory.

As will be further described below, the trellis coded modulation (TCM) reduces a number of data bits carried by each signal per polarization from 4 bits to 3 bits. In some embodiment, although the data rate at the input of the TCM encoder 40 may be lower, e.g., 200Gb/sec, after TCM encoding, the line rate, as well as the constellation in the second mode, i.e., 400G mode, remains the same as DP16QAM in the first mode, i.e., 1T mode 10. For example, following TCM encoding, the encoded symbols are processed through the digital signal processor (DSP) 20 for pulse-shaping and pre-equalization. In some embodiments, the output bits from TCM encoder 40 may be mapped into 16QAM modulation points using a bit mapping rule, wherein the TCM encoder 40 can send 16QAM signals for pulse shaping and pre-equalization prior to converting to optical carriers. Following pulse-shaping/pre-equalization at the DSP, the digital signal is converted to an optical signal at the optical modulator 30, which may referred to as upconverting to optical carriers. The proposed scheme is transparent to the encoder, i.e., TCM encoder 40, thus reducing the overhead to change baud rate for different bit rates.

Figure 3:
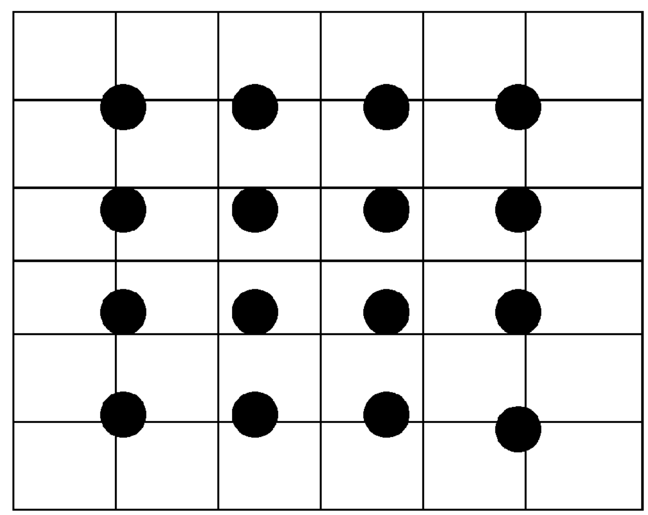
FIG. 3 illustrates on embodiment of a constellation diagram produced by the transreceiver of the present disclosure.

FIG. 3 illustrates one embodiment of a constellation produced by the transmitting architecture including the first mode, i.e., 1T mode 10, and second mode, i.e., 400g mode 35, of data transmission, in accordance with this embodiment of the present disclosure. A constellation diagram is a representation of a signal modulated by a digital modulation scheme, such as quadrature amplitude modulation (QAM). It displays the signal as a two-dimensional scatter diagram in the complex plane at symbol sampling instants. In a more abstract sense, it represents the possible symbols that may be selected by a given modulation scheme as points in the complex plane.

In one embodiment, a method of transmitting a data signal is provided that includes integrating a trellis encoder/decoder, e.g., TCM encoder 40, into a transreceiver for 16 quadrative amplitude modulation (QAM) to provide a first and second mode of modulation. Each of the first and second mode of modulation has a same baud rate, e.g., 40G. The method further includes transmitting data from the transreceiver via a processor. The data is transmitted at the first mode of modulation with a plurality of first subcarriers, e.g., four subcarriers, with DP16QAM modulation to provide a substantially 1T data transmission rate, or the data is transmitted from the transreceiver at the second mode of modulation with a plurality of second subcarriers, e.g., two subcarriers, with trellis coded modulation to provide a substantially 400G data transmission rate.

In one embodiment, the plurality of first subcarriers employed in the first mode of data transmission, i.e., 1T mode 10, includes four subcarriers each modulating data at a 250Gbisec data rate. In one embodiment, the plurality of second subcarriers in the second mode of data transmission, i.e., 400G mode 35, includes two subcarriers each modulating data at 200Gb/sec. In some embodiments, the first mode, i.e., 1T mode 10, and the second mode, i.e., 400G mode 35, of data transmission use a same hardware architecture and a same receiver side digital signal processing algorithm prior to symbol slicer block.

Figure 4:
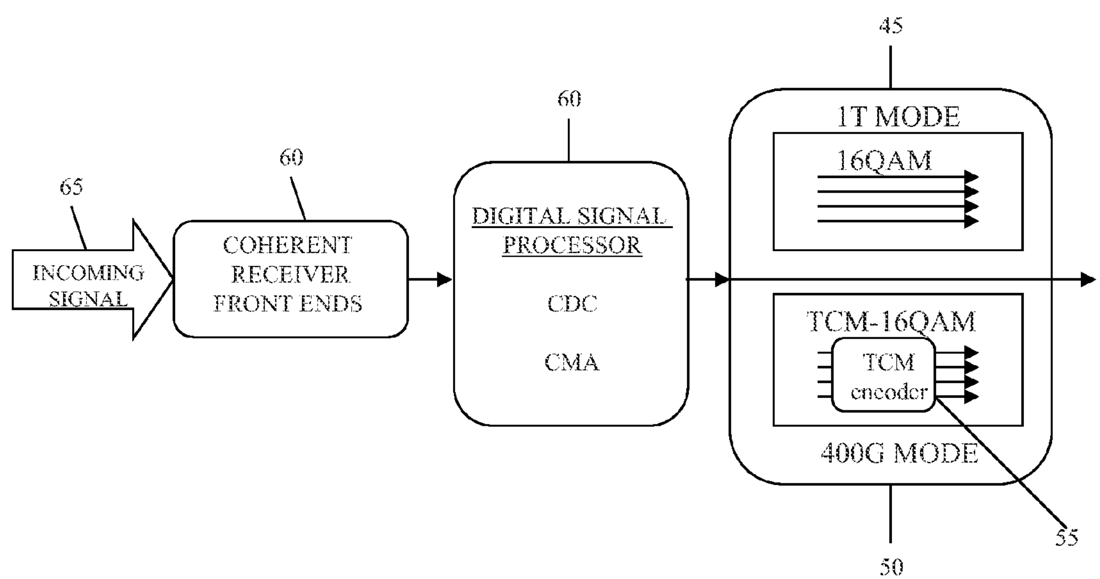
FIG. 4 is a block/flow diagram of a system and method for receiving a data signal, in accordance with one embodiment of the present disclosure.

Referring to FIG. 4, at the receiver side of the transceiver, a 16QAM DSP algorithm can be applied to both modes, 1T mode 45 and 400G mode 50, in the same receiver architecture. In the 1T mode 45, the recovered 16QAM constellations will be sent to a 16QAM slicer to have 4 bit/symbol outputs. In the 400G mode 50, instead of using the 16QAM slicer, a TCM decoder 55 is used to recover bits. The TCM decoder 55 may employ a Viterbi algorithm to recover the bits.

Referring to FIG. 4, receiving a data signal at the receiver side of the transreceiver can begin with the coherent receiver front ends 60, which receive an incoming optical signal 65, e.g., an optical signal at 1T or 400G data rate. The coherent receiver front ends 60 may begin the process of converting the incoming optical signal 65 to an electrical signal, which can be referred to as downgrading. Following processing with the coherent receiver front ends 60, a digital signal processor (DSP) 70 may be employed to remove any artifacts and impairments from the digital signal. These processes can include the application of chromatic dispersion compensation (CDC) and/or a constant modulus algorithm (CMA). The digital signal may then be converted to bits by bit de-mapping. Bit de-mapping may be provided by at least one of two modes, e.g., a first mode, i.e., 1T mode 45, or a second mode, i.e., a 400G mode 50 that employs a TCM decoder 55.

In one embodiment, the method of receiving a data signal may include integrating a trellis code modulation (TCM) decoder into a transreceiver for 16 quadrative amplitude modulation (QAM). The TCM decoder may be integrated into the transreceiver using an integration module that can include the application of a hardware processor and memory. In some embodiments, the transreceiver is configured for receiving a first data signal that has been transmitted using a first mode of modulation for a 1T data transmission rate or a second data signal that has been transmitted using a second mode of modulation for a 400G data transmission rate. Similar to data transmission, data reception may use the same constellation for both the first mode and second mode of data modulation.

In some embodiments, following the receipt of the data signal with the transreceiver, the data is decoded with a processor, wherein the first mode of modulation of the 1T data transmission rate, i.e., 1T mode 45, is decoded using a 16QAM slicer, or the second mode of modulation of the 400G data transmission rate, i.e., 400G mode 50, is decoded using a trellis code modulation (TCM) decoder 55 followed by the 16QAM slicer. In some embodiments, receiving data with the transceiver using one of the first mode, i.e., 1T mode 45, and second mode, i.e., 400G mode 50, of data reception may include a data reception module, which can include a hardware processor and memory.

The 16QAM slicer decodes the first mode of modulation, i.e., 1T mode 45, to have 4 bit per symbol outputs. The TCM decoder 55 decodes the second mode of modulation, i.e., 400G mode 50, to have 3 bit per symbol outputs. For example, the TCM decoder 55 can apply a Viterbi algorithm. The Viterbi algorithm is a dynamic programming algorithm for finding the most likely sequence of hidden states—called the Viterbi path—that results in a sequence of observed events, which may be in the context of Markov information sources and hidden Markov models. The transition between states specifies the potential 16QAM symbols transmitted from receiver and could facilitate Viterbi algorithm to effectively find the most likely path. Due to the encoding memory of TCM approach, there are only four states to perform the Viterbi detection without incurring much complexity to the receiver processor. In some embodiments, the TCM decoder 55 converts the digital signal received from the digital signal processor 70 to symbols correlating to 3 bits using an algorithm, such as the Viterbi algorithm. Thereafter, the symbols provided by the TCM decoder are converted to a 3 bits of data per symbol using the 16QAM slicer. The architecture that is described herein can provide a versatile solution to the carriers by having two 400G/1T modes within single transponder. It offers the better modulation format by considering the existing link performance. In particular, the presence of TCM can achieve 8QAM-like performance, thus providing higher system margin/longer transmission reach than 1T data rate mode. The solution here consumes less power by sharing the same hardware front-ends and DSP algorithms.

Figure 5:
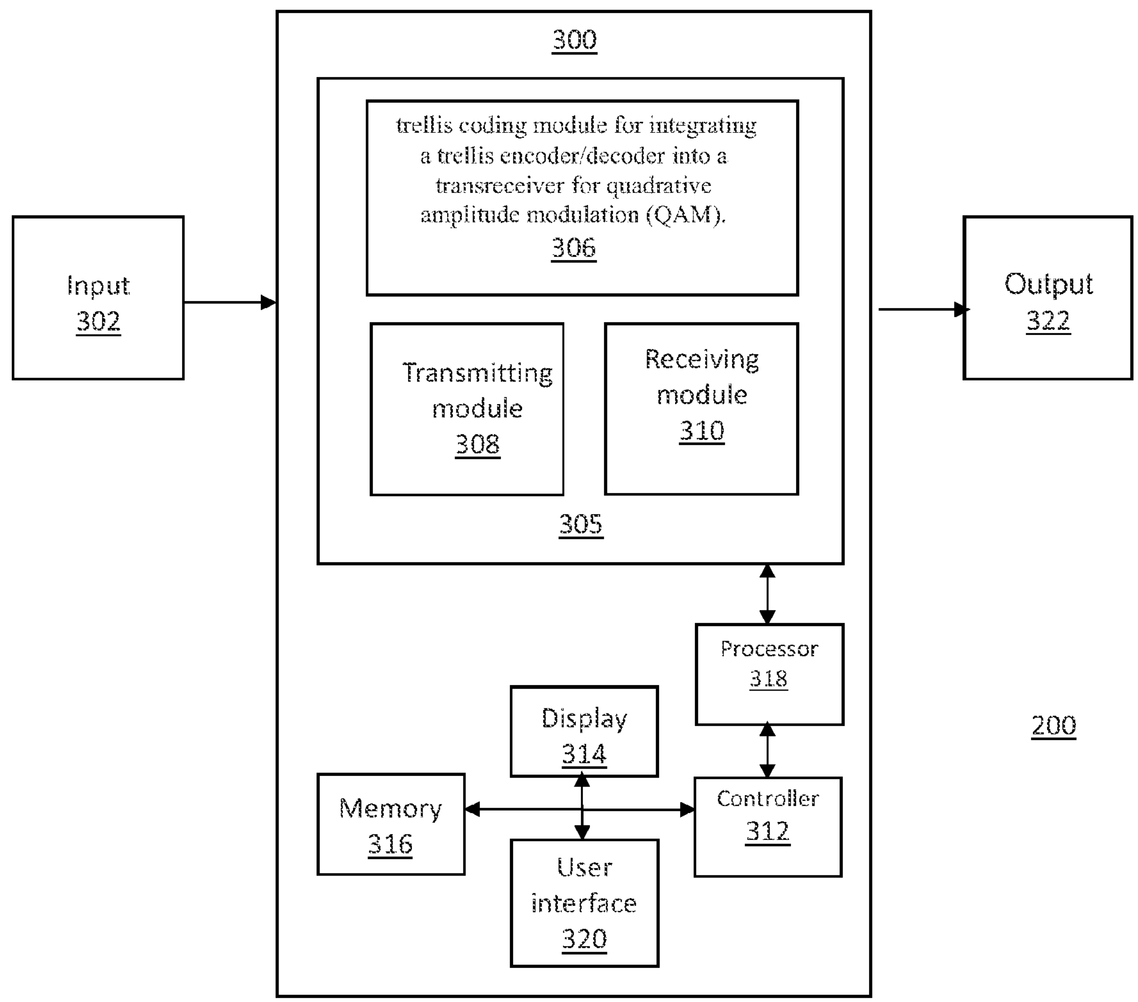
FIG. 5 shows an exemplary system to perform the methods for transmitting and receiving 1T/400G data signals, in accordance with the present disclosure.

FIG. 5 depicts one embodiment of a system to perform methods for transmitting and receiving data signals at data rates at a first mode of 1T and at a second mode of 400G. In one embodiment, the system 300 preferably includes one or more processors 318 and memory 308, 316 for storing applications, modules and other data. In one example, the one or more processors 118 and memory 308, 306 may be components of a computer, in which the memory may be random access memory (RAM), a program memory (preferably a writable read-only memory (ROM) such as a flash ROM) or a combination thereof. The computer may also include an input/output (I/O) controller coupled by a CPU bus. The computer may optionally include a hard drive controller, which is coupled to a hard disk and CPU bus. Hard disk may be used for storing application programs, such as some embodiments of the present disclosure, and data. Alternatively, application programs may be stored in RAM or ROM. I/O controller is coupled by means of an I/O bus to an I/O interface. I/O interface receives and transmits data in analog or digital form over communication links such as a serial link, local area network, wireless link, and parallel link.

The system 300 may include one or more displays 314 for viewing. The displays 314 may permit a user to interact with the system 300 and its components and functions. This may be further facilitated by a user interface 320, which may include a mouse, joystick, or any other peripheral or control to permit user interaction with the system 300 and/or its devices, and may be further facilitated by a controller 312. It should be understood that the components and functions of the system 300 may be integrated into one or more systems or workstations. The display 314, a keyboard and a pointing device (mouse) may also be connected to I/O bus of the computer. Alternatively, separate connections (separate buses) may be used for I/O interface, display, keyboard and pointing device. Programmable processing system may be preprogrammed or it may be programmed (and reprogrammed) by downloading a program from another source (e.g., a floppy disk, CD-ROM, or another computer).

The system 300 may receive input data 302 which may be employed as input to a plurality of modules 305, including at least an integration module 306 for integrating a trellis encoder/decoder into a transreceiver for 16 quadrative amplitude modulation (QAM), a transmission module 308 for transmitting data from the transceiver, and a reception module 310 for receiving data from the transceiver. The system 300 may produce output data 322, which in one embodiment may be displayed on one or more display devices 314. It should be noted that while the above configuration is illustratively depicted, it is contemplated that other sorts of configurations may also be employed according to the present principles.

In one embodiment, the system may include an integration module 306 for integrating a trellis encoder/decoder into a transreceiver for 16 quadrative amplitude modulation (QAM) to provide a first and second mode of modulation, wherein each mode has a same baud rate.

In some embodiments, the system further includes a data transmission module 308 for transmitting data from the transreceiver with a processor. The data can be transmitted at the first mode of modulation with a plurality of first subcarriers with DP16QAM modulation to provide a substantially 1T data transmission rate, or the data can be transmitted from the transreceiver at the second mode of modulation with a plurality of second subcarriers with trellis coded modulation to provide a substantially 400G data transmission rate.

In some embodiments, the system further includes a receiving module 310 for receiving a data signal with the transreceiver. The data received in the receiving module being decoded with a processor. The first mode of modulation of the 1T data transmission rate may be decoded using a 16QAM slicer, or the second mode of modulation of the 400G data transmission rate may be decoded using a trellis code modulation (TCM) decoder followed by the 16QAM slicer.

Trellis coded modulation (TCM) scheme equips the 16QAM transponder to have dual-modes for carrying 250Gb/s or 200Gbis client data, the flexibility that is necessary for the efficient system operation and better resource utilization. The TCM scheme can match the regular 16QAM transponder's design, since they share the same electrical/optical front-ends and DSP algorithm, thus reducing cost to modify the 16QAM transmitter. The capability of switching between 400G/1T data rate can allow for the carrier to choose the best cost-effective solution to their own specific needs.

Trellis Coded Modulation (TCM) Encoding

Figure 6:
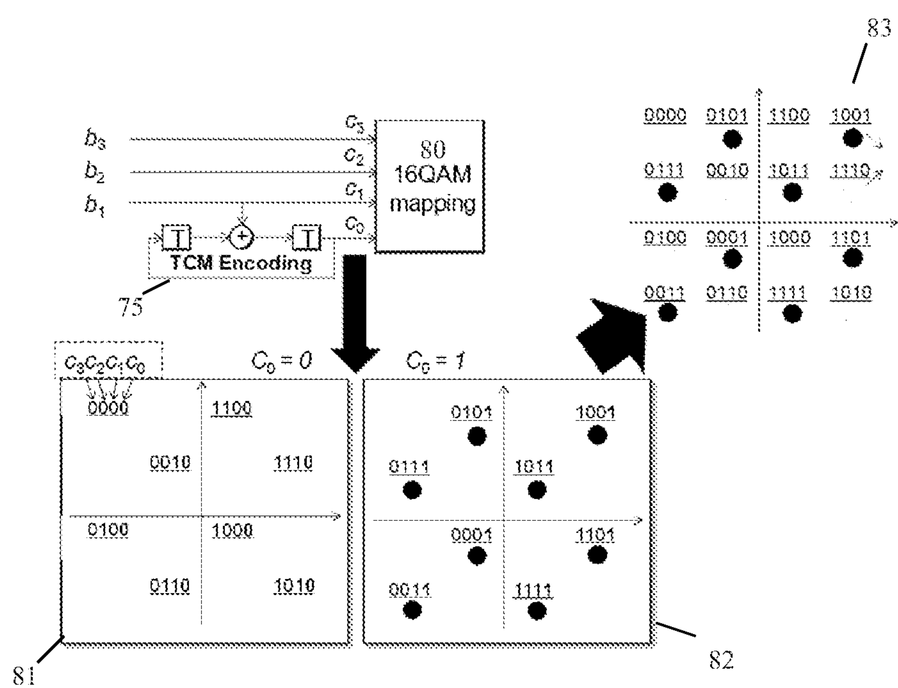
FIG. 6 is a flow diagram depicting one embodiment of encoding using a trellis code modulation (TCM) encoder, in accordance with one embodiment of the present disclosure.

The TCM encoding 75 is to utilize the set-partition of the regular 16QAM constellation. TCM encoding 75 divides the regular 16QAM constellation into 2 sets, shown in FIG. 6, where the last bit (Co) decides which set the encoded bits belong to. This may be referred to as set partitioning. The first set 81 is identified by the notation $c_0=0$, and the second set 82 is identified by the notation $c_0=1$. The TCM encoding 75 does not alter data bits $b_1$, $b_2$, and $b_3$ by passing them directly to coding $c_1$, $c_2$, and $c_3$, respectively. $c_0$ is the convolutional encoding outputs from a 4-state machine using the inputs $b_1$. The separation of the 16QAM constellation into two sets could increase the Euclidean distance of the symbols by twice compared to regular DP-16QAM, thus providing better receiver sensitivity improvement. In the embodiment that is depicted in FIG. 6, the TCM encoding 75 includes two symbol delays T. This arrangement is integrated into a 16QAM mapping scheme 80. The TCM encoding 75 introduces memory into the output 16QAM symbols for enhancing the error correction capability at receiver side when applying Viterbi algorithm. Following set partitioning, the two sets 81, 82 may be combined into a single constellation 83 without using gray mapping.

EXAMPLES

The experimental apparatus included 12 external cavity lasers (ECL) lasers separated by 41 GHz and combined using couplers into odd and even sets. Each set was modulated at 40 Gbaud by the same I/Q modulator driven by a DAC operating at 64 Gsa/s. Even and odd channels were modulated with separate random patterns of length 256K. After the modulators, a polarization multiplexing emulator was used. The modulated carriers were combined with 80 CW lasers and launched into the transmission loop consisting of eight ultra-low loss, large effective area single-mode fiber with 60 km span length. Two additional EDFAs were inserted in the loop to compensate for the gain equalizer and the loop switch losses. After the loop, the measured channel is selected by an optical filter and captured using a coherent receiver attached to a real-time oscilloscope with 80 GHz sampling rate and 32 GHz bandwidth. Only the 8 subcarriers which would make up 4×400G or 2×1T super-channels are measured. The remaining 4 subcarriers at the edges act as interference sources. For each subcarrier measured, the captured data is processed offline.

In the offline processing, either digital back propagation was used for nonlinear compensation (NLC) with a one step per span, or only chromatic dispersion compensation (CDC) was performed by a fixed frequency domain equalizer in a single step. For digital nonlinear compensation (NLC), dispersive and nonlinear penalties were compensated span by span, starting from the last span and ending with the first span. After the CDC or NLC, a time domain equalizer was used to compensate for slowly varying effects. The time domain equalizer filter taps were determined first by blind modified constant modulus algorithm (CMA) followed by decision directed adaptation. In the case of DP 16QAM, the obtained constellation was sliced with the standard grid to estimate the bit error rate (BER).

Figure 7A:
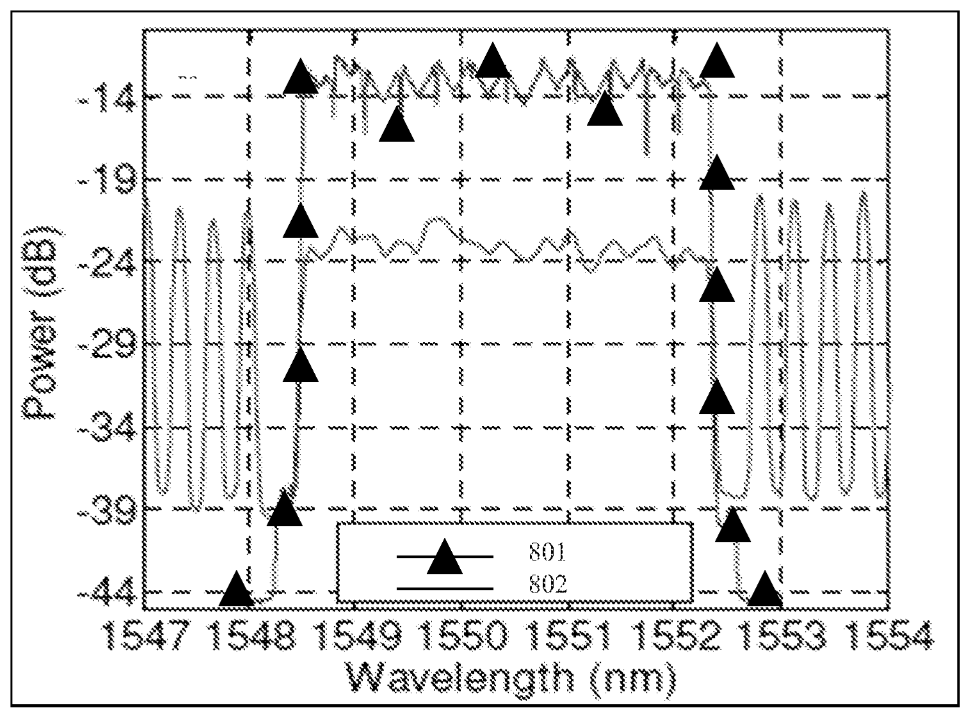
FIG. 7A is a plot of the spectrum of 12 Nyquist-shaped 40 Gbaud channels at 41 GHz spacing at a transmitter side (red) with 0.01 nm resolution, and after 6700 km transmission (blue) with 0.1 nm resolution, in accordance with one example of the present disclosure.

For the TCM-DP16QAM, a soft Viterbi algorithm was used to recover the corrected bits. For each subcarrier, a total of 106 symbols was measured and averaged for BER measurement. FIG. 7A shows the spectrum of the 12 subcarriers at the transmitter side at 0.01 nm resolution, as well as the received spectrum after 6700 km at 0.1 nm resolution. The steep cut off at the Nyquist frequency can be clearly seen at high resolution which enables tight channel spacing. The plot line identified by reference number 802 in FIG. 7A represents after transmission data, and the plot line identified by reference number 801 represents back to back data.

Figure 7B:
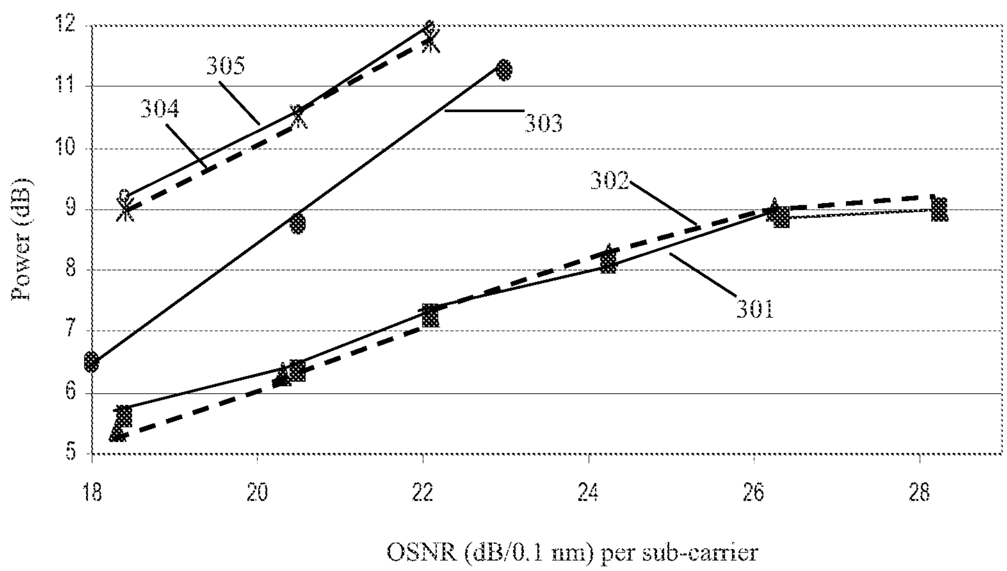
FIG. 7B is a plot of receiver sensitivity measurements for 400G and 1Tb/s data rate, in accordance with another example of the present disclosure.

FIG. 7B shows the back-to-back receiver sensitivity measurement for both DP16QAM and TCM-DP16QAM in both wavelength-division multiplexing (WDM) and single channel configuration. The plot line identified by reference number 301 is for data representative of DO16QAM single channel; the plot line identified by reference number 302 is for data representative of 16QAM WDM; the plot line identified by reference number 303 is for 16QAM theory; the plot line identified by reference number 304 is for data representative of TCM116QAM single channel; and the plot line identified by reference number 305 is TCM16QAM WDM. The penalty from WDM neighbors was negligible for both modulations. However, there was a sizable implementation penalty observed compared to theoretical receiver sensitivity curve since the baud-rate is pushed beyond the nominal DAC bandwidth of 18 GHz.

Figure 8A:
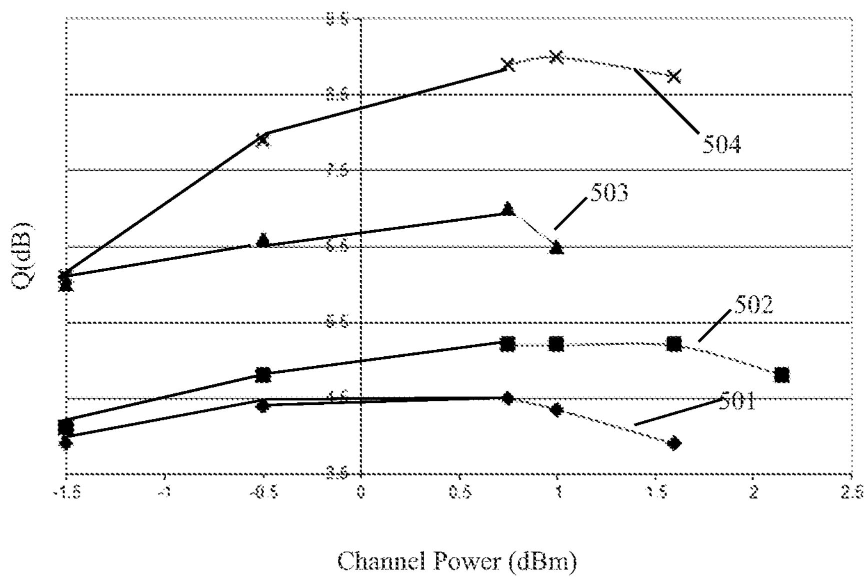
FIG. 8A is a plot of channel power dependency curves for 400G (red) and 1Tb/s (blue) super channels after 6700 km with (solid) compensation and without (dashed) nonlinear compensation, in accordance with one example of the present disclosure.
Figure 8B:
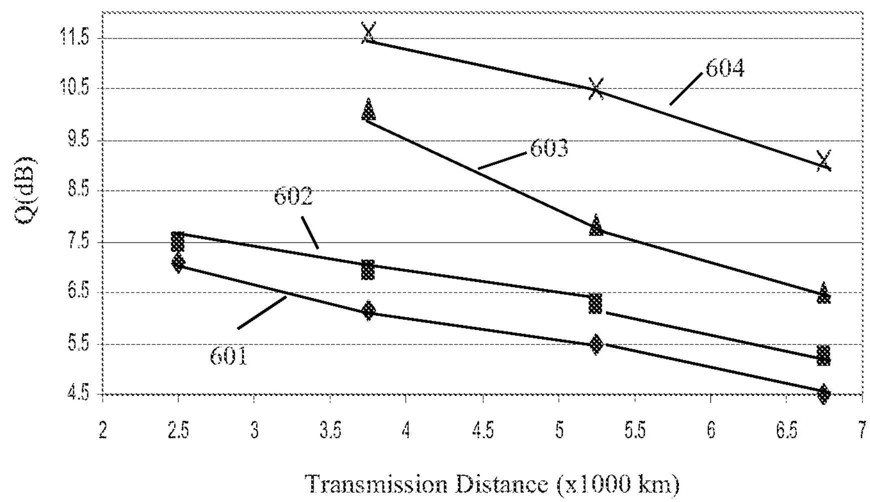
FIG. 8B is a plot of Q value against transmission distance, in accordance with one example of the present disclosure.
Figure 8C:
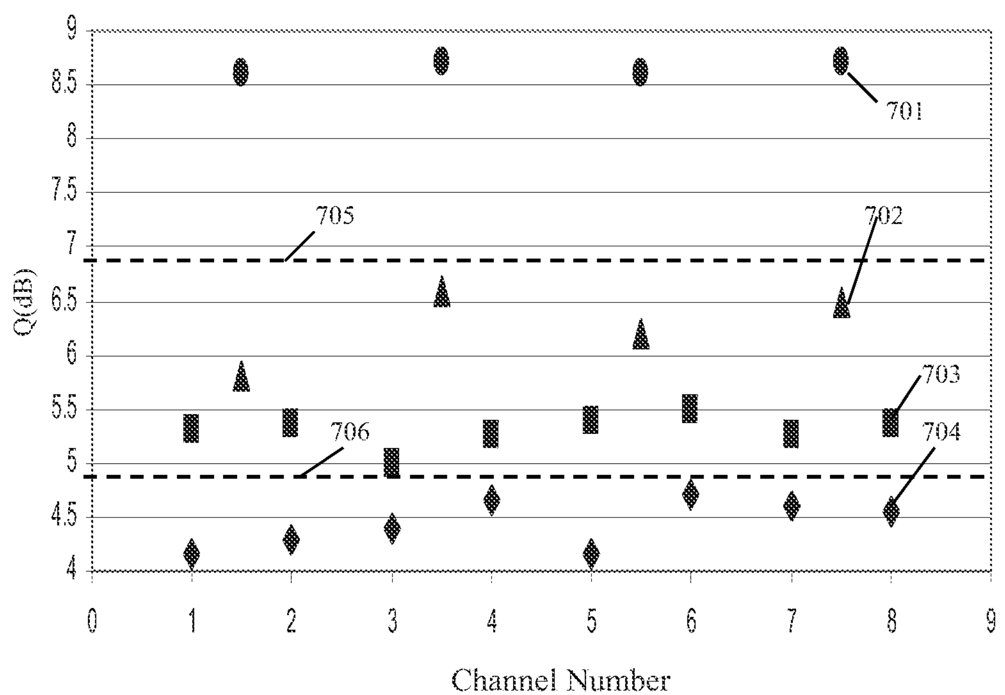
FIG. 8C is a plot of Q value of four 400G super channels (red) and subcarriers of two 1T superchannels after 6700 km, with and without nonlinear compensation, in accordance with one example of the present disclosure.

FIGS. 8A-8C show the results of the transmission experiment. In FIG. 8A the plot line identified by reference number 501 is for data provided by 1T CDC; the plot line identified by reference number 502 is for data provided by 1T NLC; the plot line identified by 503 is for 400G CDC; and the plot line identified by 504 is for data for 400G NLC. In FIG. 8B the plot line identified by reference number 601 is for data provided by 1T CDC; the plot line identified by reference number 602 was provided by 1T NLC; the plot line identified by reference number 603 was provided by 400G CDC; and the plot line identified by reference number 604 is for 400G NLC. In FIG. 8C the data points corresponding to the symbol identified with reference number 704 represent 1T CDC data; the data points corresponding to the symbol identified with reference number 703 represent 1T NLC data; the data points corresponding to the symbol identified with reference number 702 represent 400G CDC data; and the data points corresponding to the symbol identified with reference number 701 represent 400G NLC. The line identified by reference number 705 is for the HDFEC limit that is equal to 6.75 dB; and the line identified by reference number 706 is for the SDFEC limit that is equal to 4.9 dB. In FIG. 8A, the channel power dependency is plotted, for both 400G signals, and 1T signals after 6700 km. For each data rate, Q value is calculated from BER either using chromatic dispersion compensation only or using nonlinear compensation by digital back propagation. For 1T signals with DP16QAM, NLC increased optimum power by 1 dB and overall Q value by 0.5 dB. In the case of 400G signals using TCMDP16QAM, NLC increased optimum Q value close to 2 dB. It is believed that such a large improvement is possible, because NLC is followed by TCM decoding, which has a larger coding gain at reduced BER. FIG. 8B shows the Q value as a function of transmission distance, with and without nonlinear compensation. A consistent amount of nonlinear improvement was achieved through the transmission for both 400G and 1T data rate.

In FIG. 8C, the Q value for the four 400G super channels and also the eight subcarriers of the two 1T super channels were plotted after 6700 km transmission. For both 1T and 400G data rate, the Q value was below the corresponding FEC thresholds. After nonlinear compensation, 1T signal was nominally above the 28% SDFEC threshold of 4.9 dB, whereas the 400G TCM 16QAM signals have at least 2 dB margin above the 20% HD FEC limit of 6.75 dB.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable medium such as a semiconductor or solid state memory, magnetic tape, a removable computer diskette, a random access memory (RAM), a read-only memory (ROM), a rigid magnetic disk and an optical disk, etc.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. Additional information is provided in an Appendix A to the application entitled, "Additional Information". It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention.

What is claimed is:

1. A method of transmitting a data signal comprising:

integrating a trellis encoder/decoder into a transreceiver receiving a signal at 40Gbaud, the transreceiver providing for 16 quadrative amplitude modulation (QAM) to provide a first and second mode of modulation, the transreceiver including using only four subcarriers each modulating data at a 250Gb/sec data rate at the 40 Gbaud that combine for simultaneous transmission to provide the first mode of modulation at a substantially 1T data transmission rate, and using only two subcarriers each modulating data at 200Gb/sec that combine to provide simultaneous transmission for the second mode of modulation at a substantially 400G data transmission rate, wherein the trellis encoder uses trellis coded modulation to reduce the modulated data to only 200Gb/sec only in the two subcarriers for the second mode of modulation; and transmitting data from the transreceiver via a processor at only a ted substantially 1T data transmission rate or substantially 400G data transmission rate, wherein the data is transmitted at the first mode of modulation with the plurality of first subcarriers with DP16QAM modulation to provide only the substantially 1T data transmission rate, or the data is transmitted from the transreceiver only at the second mode of modulation with the plurality of second subcarriers with trellis coded modulation to provide the substantially 400G data transmission rate.

2. The method of claim 1, wherein the trellis coded modulation reduces a number of data bits carried by each signal per polarization from 4 bits to 3 bits.

3. The method of claim 1, where the first mode and the second mode of data transmission use a same hardware architecture and a same receiver side digital signal processing algorithm prior to symbol slicer block.

4. The method of claim 1 , wherein in the first mode of modulation incoming bits are mapped into 16QAM modulation points using a bit mapping rule and sends gray coded signals for pulse shaping and pre-equalization prior to converting to optical carriers.

5. The method of claim 1 wherein in the second mode of modulation incoming bits are processed through a trellis code modulation (TCM) encoder.

6. The method of claim 5, wherein output bits from the TCM encoder are mapped into 16QAM modulation points using a bit mapping rule and sends 16QAM signals for pulse shaping and pre-equalization prior to converting to optical carriers.

7. The method of claim 1 further comprising a non-transitory computer readable medium comprising a computer readable program for executing the method of transmitting the data signal, wherein the computer readable program is executed on a computer.

8. A system for transmitting a data signal comprising:

an integration module for integrating a trellis encoder/decoder into a transreceiver receiving a signal at 40Gbaud for 16 quadrative amplitude modulation (QAM) to provide a first and second mode of modulation, the transreceiver including only four subcarriers each modulating data at a 250Gb/sec data rate at the 40 Gbaud that combine for simultaneous transmission to provide the first mode of modulation at a substantially 1T data transmission rate, and only two subcarriers each modulating data at 200Gb/sec that combine for simultaneous transmission for the second mode of modulation at a substantially 400G data transmission rate, wherein the trellis encoder/decoder uses trellis coded modulation to reduce the modulated data to only 200Gb/sec only in the two subcarriers for the second mode of modulation; and a data transmission module for transmitting data from the transreceiver with a processor at only a selected substantially 1T data transmission rate or substantially 400G data transmission rate, wherein the data is transmitted at the first mode of modulation with the plurality of first subcarriers with DP16QAM modulation to provide the substantially 1T data transmission rate, or the data is transmitted from the transreceiver at the second mode of modulation with the plurality of second subcarriers with the trellis coded modulation to provide the substantially 400G data transmission rate.

9. The system of claim 8, wherein the trellis coded modulation reduces a number of data bits carried by each signal per polarization from 4 bits to 3 bits.

* * * * *